United States Patent
Kim et al.

(10) Patent No.: US 8,284,618 B2
(45) Date of Patent: Oct. 9, 2012

(54) DATA INPUT DEVICE OF SEMICONDUCTOR MEMORY APPARTUS AND CONTROL METHOD THEREOF

(75) Inventors: Ki-Ho Kim, Gyeonggi-do (KR);
Young-Jun Ku, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 571 days.

(21) Appl. No.: 12/490,859

(22) Filed: Jun. 24, 2009

(65) Prior Publication Data
US 2010/0165750 A1    Jul. 1, 2010

(30) Foreign Application Priority Data

Dec. 26, 2008   (KR) .................. 10-2008-0134896

(51) Int. Cl.
*G11C 7/10* (2006.01)
(52) U.S. Cl. ............... 365/189.05; 365/230.08; 326/87; 327/77
(58) Field of Classification Search ............. 365/230.08, 365/189.05; 326/87; 327/77, 85
See application file for complete search history.

(56) References Cited

U.S. PATENT DOCUMENTS

| | | | |
|---|---|---|---|
| 5,828,235 A * | 10/1998 | Horiguchi et al. | 326/121 |
| 6,801,061 B2 * | 10/2004 | Cowles | 327/108 |
| 6,897,684 B2 * | 5/2005 | Oi et al. | 326/86 |
| 6,943,585 B2 * | 9/2005 | Lee et al. | 326/58 |
| 7,274,606 B2 | 9/2007 | Stave | |
| 7,279,934 B2 * | 10/2007 | Do | 326/83 |
| 7,804,333 B2 * | 9/2010 | Kim | 327/52 |
| 7,936,614 B2 * | 5/2011 | Kim et al. | 365/189.07 |
| 2009/0010191 A1 | 1/2009 | Wentink | |

FOREIGN PATENT DOCUMENTS

| | | |
|---|---|---|
| JP | 2009-500959 A | 1/2009 |
| KR | 1020000057085 | 9/2000 |
| KR | 100672128 | 1/2007 |
| WO | WO 2007/008579 A2 | 1/2007 |

OTHER PUBLICATIONS

Notice of Allowance issued from Korean Intellectual Property Office on Aug. 27, 2010.

* cited by examiner

*Primary Examiner* — Tuan T Nguyen
*Assistant Examiner* — Lance Reidlinger
(74) *Attorney, Agent, or Firm* — IP & T Group LLP

(57) ABSTRACT

A data input device of a semiconductor memory apparatus includes: a differential amplifier configured to compare an input to a reference voltage and output a differential signal based on the comparison; and a control circuit configured to adjust a current driving capacity of the differential amplifier by turning on a first current path connected to the differential amplifier in response to a first enable signal and turning off a second current path connected to the differential amplifier in response to a second enable signal in a standby mode, wherein, during a time that a plurality of external command signals toggle back and forth between a status of all being high signals and a status of all being low signals repeatedly, the second enable signal is controlled to be maintained at a low state signal.

17 Claims, 8 Drawing Sheets

| Function | CKE | | CSb | RASb | CASb | Web | BA0~BAx | Axx~A11 | A10 | A9~A0 |
|---|---|---|---|---|---|---|---|---|---|---|
| | Previous Cycle | Current Cycle | | | | | | | | |
| Mode Register Set | H | H | L | L | L | L | BA | OP Code | | |
| Refresh | H | H | L | L | L | H | x | x | x | x |
| Self Refresh Entry | H | L | L | L | L | H | x | x | x | x |
| Self Refresh Exit | H | H | H | x | x | x | x | x | x | x |
| | | | L | H | H | H | | | | |
| Single bank Precharge | H | H | L | L | H | L | BA | x | L | x |
| all bank precharge | H | H | L | L | H | L | x | x | H | x |
| Bank Avtive | H | H | L | L | H | H | BA | Row Address | | |
| Write | H | H | L | L | H | L | BA | Column | L | Coulmn |
| Write with Auto Precharge | H | H | L | H | L | L | BA | Column | H | Coulmn |
| Read | H | H | L | H | L | H | BA | Column | L | Coulmn |
| Read with Auto Precharge | H | H | L | H | L | H | BA | Column | H | Coulmn |
| No Operation | H | x | L | H | H | H | x | x | x | x |
| Device Deselect | H | x | H | x | x | x | x | x | x | x |
| Power Down Entry | H | L | H | x | x | x | x | x | x | x |
| | | | L | H | H | H | | | | |
| Power Down Exit | L | H | H | x | x | x | x | x | x | x |
| | | | L | H | H | H | | | | |

DATA INPUT DEVICE OF SEMICONDUCTOR MEMORY APPARTUS AND CONTROL METHOD THEREOF

CROSS-REFERENCE TO RELATED APPLICATION

The present application claims priority of Korean Patent Application No. 10-2008-0134896, filed on Dec. 26, 2008, the disclosure of which is incorporated herein by reference in its entirety.

BACKGROUND OF THE INVENTION

The present invention relates to a semiconductor memory apparatus, and more particularly, to a data input device of a semiconductor memory apparatus which buffers inputted data and a method for controlling the same.

Semiconductor memory apparatuses have been essential components in most electronic products. For example, semiconductor memory apparatuses are used in various electronic products such as personal computers, televisions, audio sets and communication terminals. The semiconductor memory apparatuses used in various fields receive and store data from different electronic elements or appliances, and provide the stored data to different electronic elements or appliances upon request. Accordingly, the semiconductor memory apparatuses need circuits or devices associated with the input and output of data between the different electronic elements or appliances and the semiconductor memory apparatuses. That is to say, the semiconductor memory apparatuses need circuits or devices for transmitting and receiving data to and from the different electronic elements or appliances.

In order to store data in a semiconductor memory apparatus, an input buffer is used to temporarily store data received from a different electronic element or appliance. Such an input buffer functions to receive data from the external electronic element or appliance, amplify the received data and convert the amplified data to a level (CMOS level) to be processed in the semiconductor memory apparatus.

This will be described with reference to FIG. 1.

Figure 1:
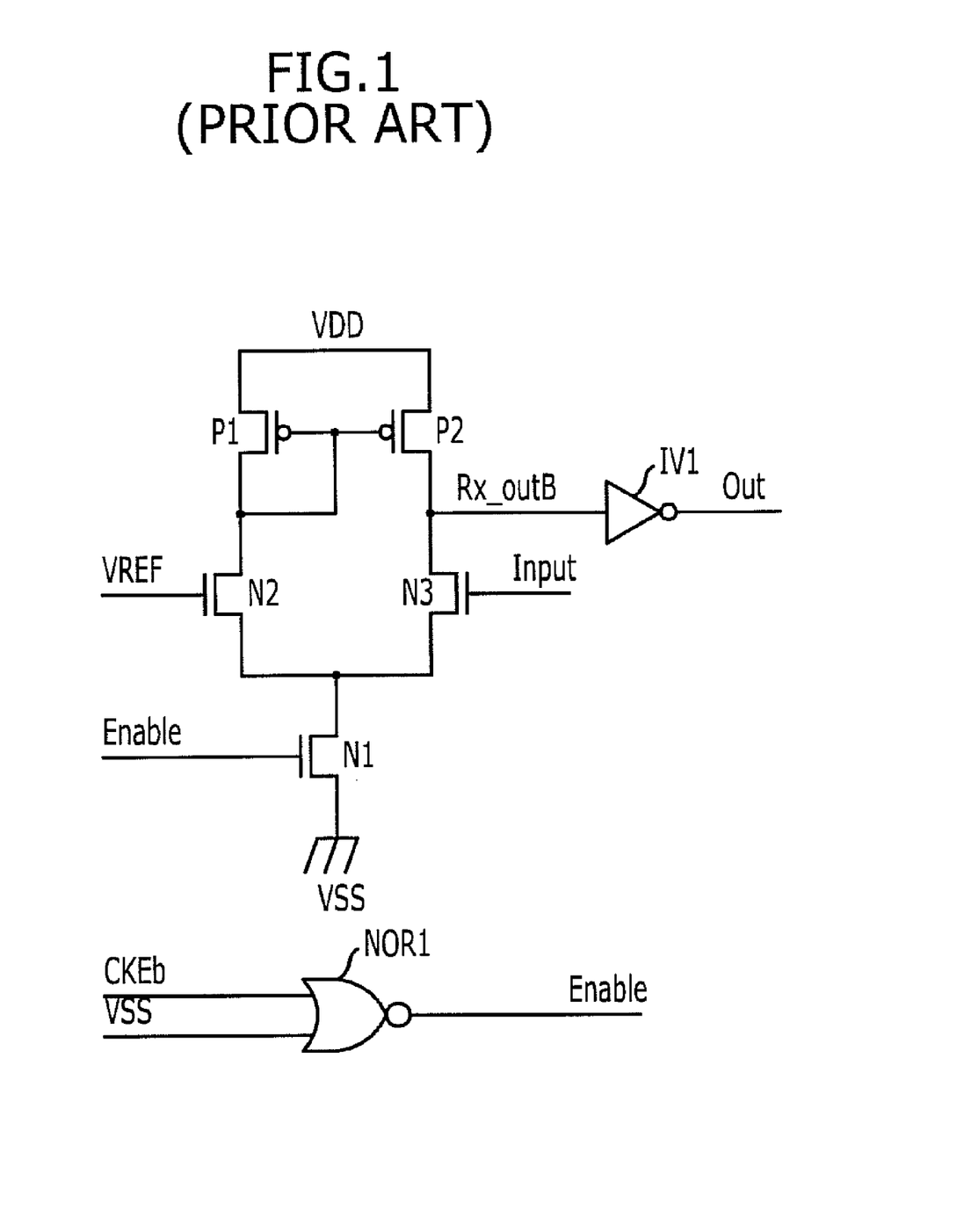
FIG. 1 is a view illustrating a conventional data input device of a semiconductor memory apparatus.

FIG. 1 is a diagram illustrating a conventional circuit for generating a differential signal as an output in an input buffer of a semiconductor memory apparatus.

The circuit includes an NMOS transistor N3 which receives an input signal INPUT through the gate thereof and an NMOS transistor N2 which receives a reference signal VREF through the gate thereof. Also, the source terminals of the NMOS transistor N3 and the NMOS transistor N2 are connected with each other so that current flows through an NMOS transistor N1. An output signal RX_OUTB is outputted from the drain terminal of the NMOS transistor N3. The output signal RX_OUTB is then outputted through an inverter IV1 which is connected in series to the NMOS transistor N3.

PMOS transistors P1 and P2 are respectively connected in series to the drain terminals of the NMOS transistors N2 and N3. The PMOS transistors P1 and P2, which have the gate terminals connected with each other, constitute a current mirror type. The PMOS transistors P1 and P2 are supplied with an external supply voltage VDD through the respective source terminals thereof.

The NMOS transistor N1 implements a control function of enabling and disabling the operation of a differential amplifier which is configured as described above. That is to say, if the NMOS transistor N1 is turned on, as a current path is formed via the NMOS transistor N1 to a ground voltage VSS, the differential amplifier switches to a status in which it can operate. Conversely, if the NMOS transistor N1 is turned off, as the current path to the ground voltage VSS is shut off, the operation of the differential amplifier is interrupted. Accordingly, an enable signal ENABLE is inputted to the gate terminal of the NMOS transistor N1. The enable signal ENABLE is obtained from the output of a NOR gate NOR1 which NORs a clock enable bar signal CKEB and the ground signal VSS.

A conventional data input device of a semiconductor memory apparatus, which is configured as described above, compares the input signal INPUT and the reference signal VREF, and generates the output signal RX_OUTB corresponding to a differential signal between the two signals. The output signal RX_OUTB generated in this way and a signal OUT inverted by the inverter IV1 are outputted. Therefore, the conventional data input device of a semiconductor memory apparatus generates the output signal RX_OUTB corresponding to the differential signal between the input signal INPUT and the reference signal VREF and the desired output signal OUT obtained by inverting the output signal RX_OUTB.

In the conventional data input device of a semiconductor memory apparatus, when the enable signal ENABLE generated by a clock enable signal externally inputted is in a high state, if an external input is greater than the reference voltage VREF, a high signal is generated, and if the external input is less than the reference voltage VREF, a low signal is generated.

Conversely, in the conventional data input device of a semiconductor memory apparatus, when the enable signal ENABLE generated by the clock enable signal externally inputted is in a low state, since the NMOS transistor N1 is turned off and current flow is cut off, the data input device does not operate regardless of whether or not an input signal is externally applied.

Figure 2:
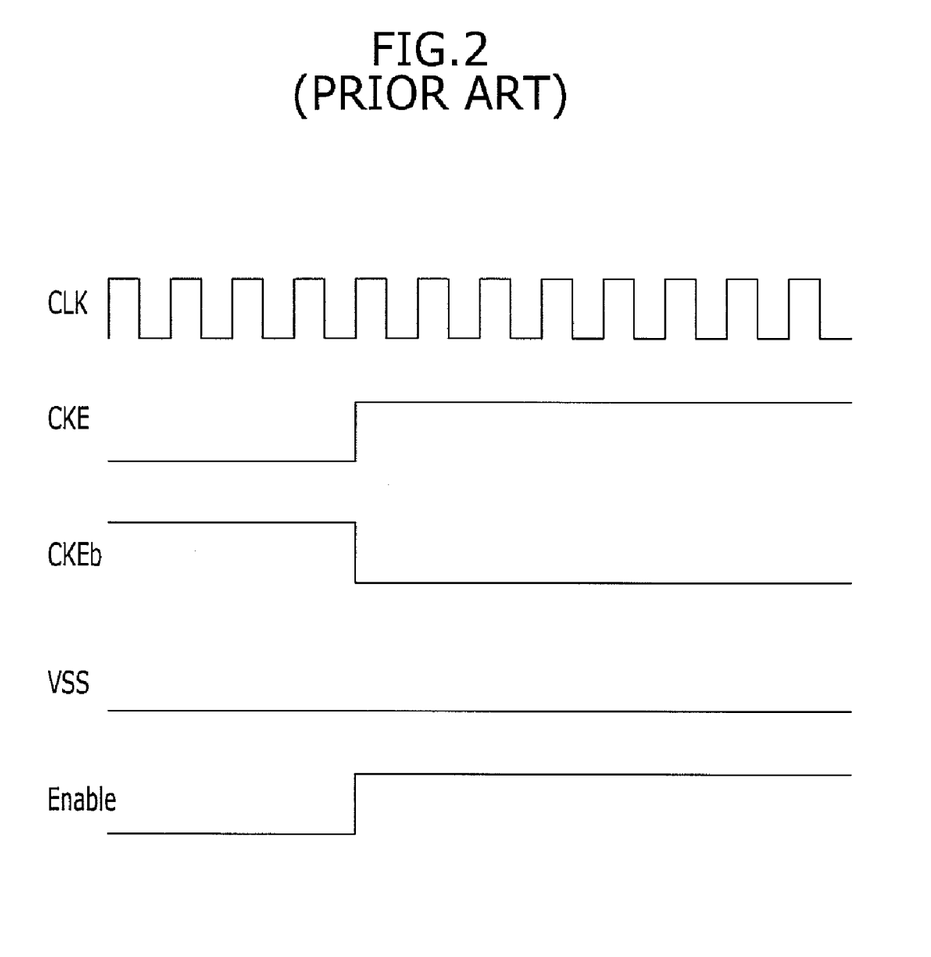
FIG. 2 is a view illustrating a scheme in which an enable signal is generated in the conventional data input device of a semiconductor memory apparatus.

FIG. 2 illustrates a scheme in which the enable signal is generated by a clock enable signal. Referring to FIG. 2, if a clock enable signal CKE is a high signal, since the enable signal ENABLE inputted to the data input device is converted to a high level, the data input device of a semiconductor memory apparatus consumes current.

Figure 3:
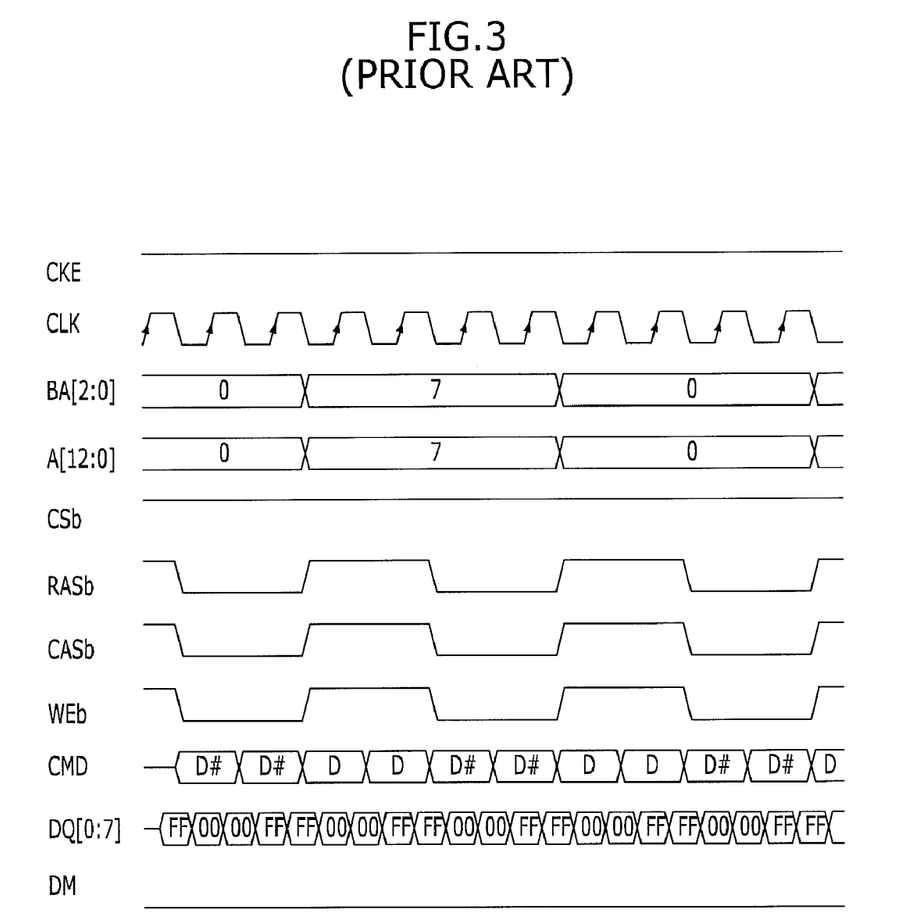
FIG. 3 is a timing diagram illustrating the operation of the conventional data input device of a semiconductor memory apparatus in a standby state.

FIG. 3 is a timing diagram illustrating the operation of the conventional data input device of a semiconductor memory apparatus in a standby state. Referring to FIG. 3, the clock enable signal CKE and an external command signal CSB are in a high state, and, while other external command signals RASB, CASB and WEB toggle per every other clock signal and an address A toggles once every four clock signals, current is consumed.

Figure 4:
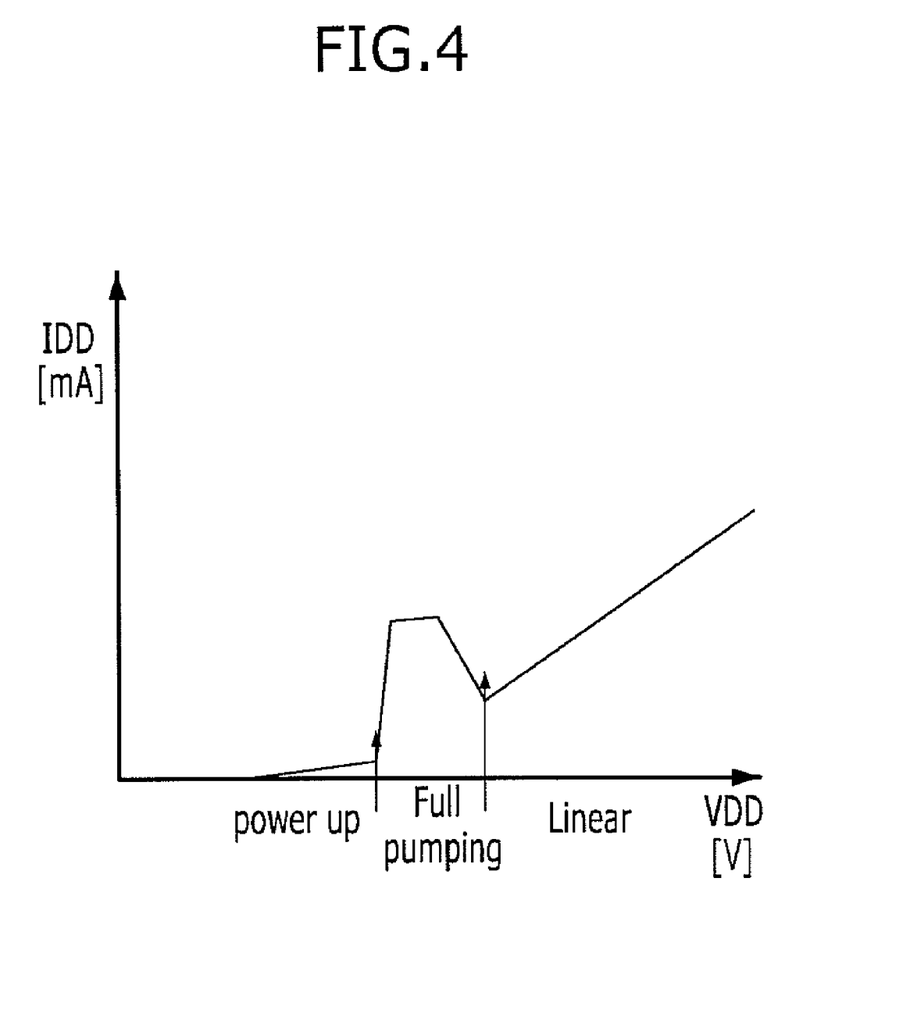
FIG. 4 is a graph showing a standby IDD curve of the conventional data input device of a semiconductor memory apparatus in the standby state.

As a consequence, in the conventional data input device of a semiconductor memory apparatus, due to the fact that current consumption increases in the standby state, a standby IDD curve as shown in FIG. 4 is obtained. Specifically, a hump occurs in the IDD curve in performing a full charge-pumping operation immediately after power supply, and thereafter, the standby IDD curve linearly increases. Accordingly, in the conventional data input device of a semiconductor memory apparatus, controlling current consumption in the standby state is desirable.

SUMMARY OF THE INVENTION

An embodiment of the present invention is directed to providing a data input device of a semiconductor memory apparatus which can reduce current consumption in a standby state and a method for controlling the same.

In accordance with an aspect of the present invention, there is provided a data input device of a semiconductor memory apparatus, including input means configured to input data; precharge means configured to supply a precharge voltage for converting inputted data to a differential signal; enable means configured to enable the input means and the precharge means to operate; and control means configured to control a current amount of the enable means in a standby mode.

In accordance with another aspect of the present invention, there is provided a method for controlling a data input device of a semiconductor memory apparatus, including enabling the data input device so that data can be inputted; controlling a current amount of the enabled data input device in a standby mode; inputting data to the data input device; and converting inputted data to a differential signal and outputting the differential signal.

In accordance with another aspect of the present invention, there is provided a data input device of a semiconductor memory apparatus, comprising, including a differential amplifier for comparing input to a reference voltage and outputting a differential signal based on the comparison; and a control circuit for adjusting a current driving capacity of the differential amplifier by turning on a first current path connected to the differential amplifier in response to a first enable signal and turning off a second current path connected to the differential amplifier in response to a second enable signal in a standby mode, wherein, during a time that external command signals toggle back and forth between a status of being all high signals or a status of being all low signals repeatedly, the second enable signal is controlled to be maintained at a low state signal.

DESCRIPTION OF SPECIFIC EMBODIMENT

Other objects and advantages of the present invention can be understood by the following description, and become apparent with reference to the embodiment of the present invention.

Figure 5:
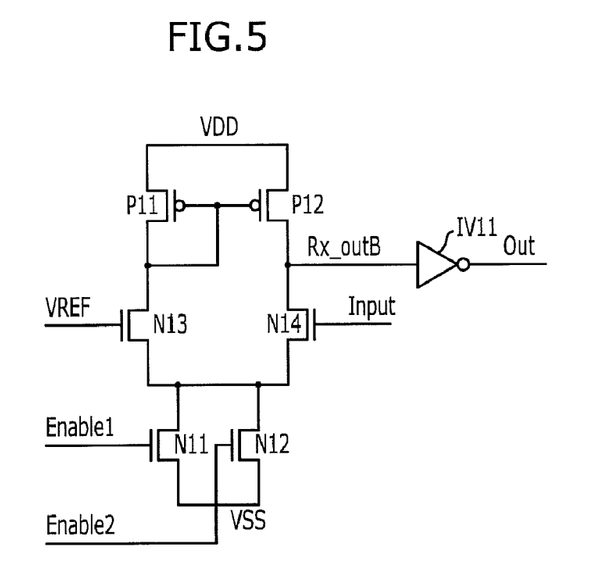
FIG. 5 is a view illustrating a data input device of a semiconductor memory apparatus in accordance with an embodiment of the present invention.

FIG. 5 is a view illustrating a data input device of a semiconductor memory apparatus in accordance with an embodiment of the present invention.

Referring to FIG. 5, a data input device of a semiconductor memory apparatus in accordance with an embodiment of the present invention includes an NMOS transistor N14 which is applied with an input signal INPUT through the gate thereof and an NMOS transistor N13 which is applied with a reference signal VREF through the gate thereof. The source terminals of the NMOS transistor N13 and the NMOS transistor N14 are connected with each other so that current can flow through an NMOS transistor N11 and an NMOS transistor N12 to a ground source VSS. An output signal RX_OUTB is outputted from the drain terminal of the NMOS transistor N14. The output signal RX_OUTB is outputted through an inverter IV11 which is connected in series to the NMOS transistor N14.

PMOS transistors P11 and P12 are connected in series to the respective drain terminals of the two NMOS transistors N13 and N14. The two PMOS transistors P11 and P12, which have the gate terminals connected with each other, constitute a current mirror. The PMOS transistors P1 and P12 are supplied with an external supply voltage VDD through the respective source terminals thereof.

The NMOS transistor N11 and the NMOS transistor N12 implement a control function of enabling and disabling the operation of a differential amplifier which is configured as described above. That is to say, if the NMOS transistor N11 is turned on, as a current path is formed via the NMOS transistor N11 to the ground source VSS, the differential amplifier switches to a status in which it can operate. Similarly, if the NMOS transistor N12 is turned on, since a current path is formed via the NMOS transistor N12 to the ground source VSS, the differential amplifier switches to a status in which it can operate. However, if both the NMOS transistor N11 and the NMOS transistor N12 are turned off, since the current paths to the ground voltage VSS are shut off, the operation of the differential amplifier is disabled.

Figure 6:
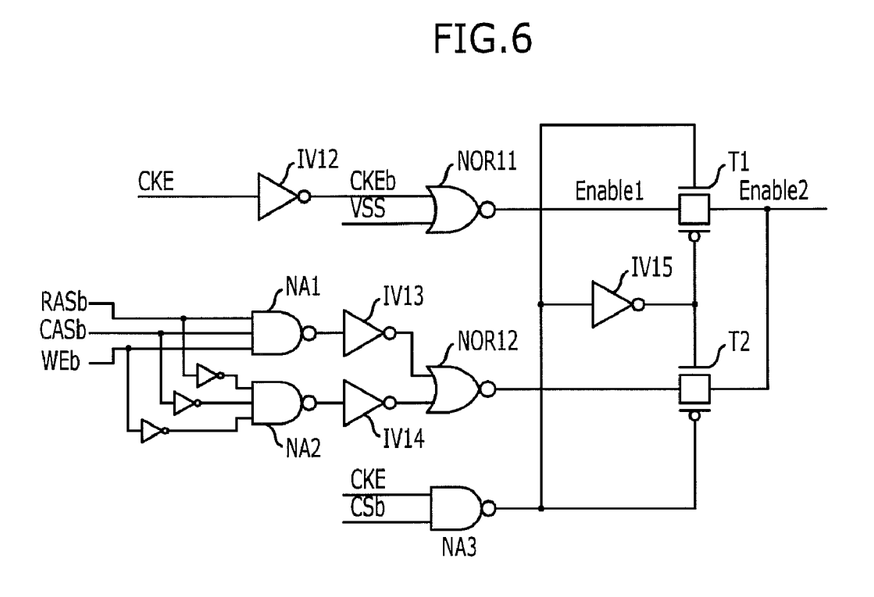
FIG. 6 is a view illustrating a scheme in which enable signals used in the data input device according to the present invention are generated.

A first enable signal ENABLE1 for turning on the NMOS transistor N11 and a second enable signal ENABLE2 for turning on the NMOS transistor N12 are generated by different source signals as shown in FIG. 6.

FIG. 6 is a control diagram for generating the first and second enable signals ENABLE1 and ENABLE2 to control the data input device shown in FIG. 5 to switch to an enabled state or a disabled state.

First, the first enable signal ENABLE1 for operating the NMOS transistor N11 is generated by a clock enable signal CKE. In other words, as the clock enable signal CKE is inverted by an inverter IV12 and a signal CKEB is generated thereby, the first enable signal ENABLE1 is generated by performing a logical NOR operation on the signal CKEB and the ground signal VSS by a NOR gate NOR11.

The second enable signal ENABLE2 maintains the same as or different state from first enable signal ENABLE1. That is to say, when a transmission gate T1 is turned on, the first and second enable signals ENABLE1 and ENABLE2 have the same state. However, when the transmission gate T1 is turned off, the first enable signal ENABLE1 is generated on the basis of the clock enable signal CKE as described above, whereas the state of the second enable signal ENABLE2 is determined by external command signals.

Namely, the second enable signal ENABLE2 for operating the NMOS transistor N12 is generated by the external command signals RASB, CASB and WEB. A logical NAND operation is performed on the external command signals RASB, CASB and WEB by a NAND gate NA1. Also, after the external command signals RASB, CASB and WEB are inverted by inverters, a logical NAND operation is performed on the inverted signals by a NAND gate NA2. By performing a logical NOR operation on the output signals of the two NAND gates NA1 and NA2 via inverters IV13 and IV14 by a NOR gate NOR12, the second enable signal ENABLE2 is generated.

The first enable signal ENABLE1 generated through the above-described operations is supplied through or intercepted by the transmission gate T1, and the second enable signal ENABLE2 generated through the above-described operations is supplied through or intercepted by a transmission gate T2. The control of the operation of the two transmission gates T1 and T2 is implemented by the output signal of a NAND gate NA3 which performs a logical NAND operation on the clock enable signal CKE and an external command signal CSB. That is to say, the transmission gate T1 and the transmission gate T2 are selectively operated by the signal obtained by inverting the output of the NAND gate NA3 through an inverter IV15 and the output of the NAND gate NA3.

As a result, the turning-on and the turning-off of the transmission gates T1 and T2 are controlled by the output signal of the NAND gate NA3, and thereby, the states of the first and second enable signals ENABLE1 and ENABLE2 are determined.

Hereinbelow, the operating procedure of the data input device of a semiconductor memory apparatus according to the present invention will be described.

In the present invention, in order to reduce current consumption in a standby state, a method of controlling current when receiving an address is adopted. In general, a semiconductor memory apparatus must be ready to receive a command and an address at any time in a standby state. In this regard, in the present invention, a method which does not disable a semiconductor memory apparatus from being responsive to a command and an address but adjusts/reduces current driving capacity is adopted in the standby state. By doing so, operations of the semiconductor memory device in a standby state do not negatively effect operations for the normal state of the semiconductor memory device.

Figure 7:
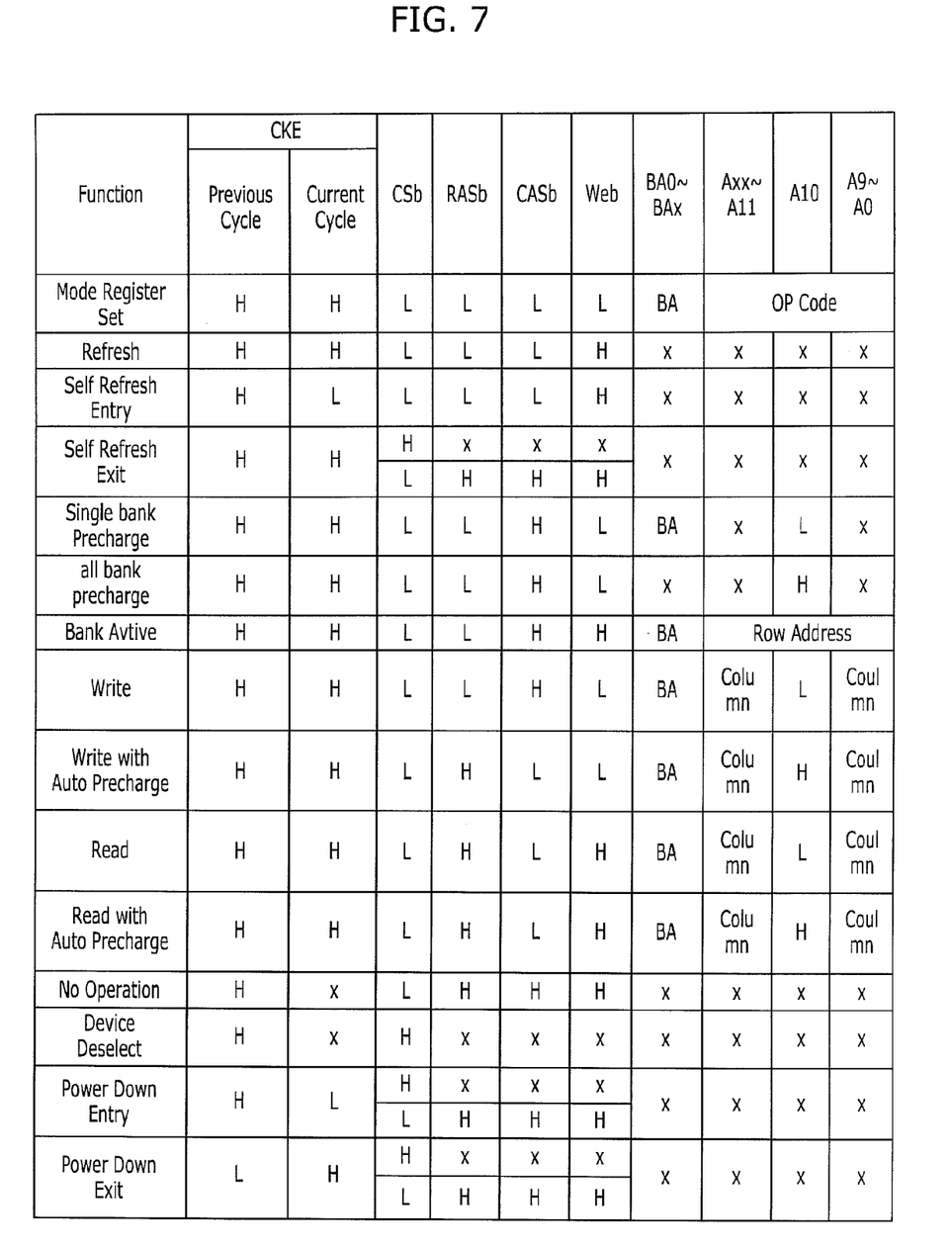
FIG. 7 is a truth table showing commands of a semiconductor memory apparatus.

FIG. 7 is a truth table showing the commands of a semiconductor memory apparatus.

As can be readily seen from the truth table in FIG. 7, in the present invention, it is desirable to consider the relations between the present invention and functions (including self refresh exit, power down exit, and device deselect) in which the clock enable signal CKE and the external command CSB are simultaneously in a high state.

The functions of self refresh exit and power down exit are implemented by the clock enable signal CKE irrespective of other commands. Also, the function of device deselect is implemented by the external command signal CSB. Accordingly, when the clock enable signal CKE and the external command signal CSB are in a high state, except the case in which the external command signals RASB, CASB and CSB operate the semiconductor memory apparatus, the address reception capability of the data input device according to the present invention can be decreased. In the present invention, when the clock enable signal CKE and the external command signal CSB are simultaneously in a high state and the external command signals RASB, CASB and WEB repeatedly toggle back and forth between a state where the external command signals in all high signals to a state where all of the external command signals are low signals, the address reception capability is decreased.

That is to say, in the data input device of a semiconductor memory according to the present invention, as shown in FIG. 5, the input signal INPUT and the reference signal VREF, which are respectively inputted to the NMOS transistors N14 and N13, are compared with each others, and the output signal RX_OUTB corresponding to a difference signal between the two signals is generated. After the output signal RX_OUTB is generated in this way, a desired output signal OUT obtained by inverting the output signal RX_OUTB by the inverter IV11 is outputted.

In the data input device of a semiconductor memory according to the present invention, as current paths are defined by the first and second enable signals ENABLE1 and ENABLE2 inputted to the NMOS transistors N11 and N12, the data input device can operate at any time. Referring to FIG. 6, the first enable signal ENABLE1 to be inputted to the NMOS transistor N11 is generated in a manner such that, when the clock enable signal CKE is a high signal, the clock enable signal CKE is inverted by the inverter IV12 and a high signal is then outputted from the NOR gate NOR11. Therefore, the state of the first enable signal ENABLE1 is determined by the clock enable signal CKE having a high level.

Also, the first enable signal ENABLE1 outputted from the NOR gate NOR11 and having the high level is controlled in its output by the operation of the transmission gate T1 and exerts an influence on the second enable signal ENABLE2. If at least one of the clock enable signal CKE and the external command signal CSB comprises a low signal, the transmission gate T1 is turned on by the output signal of the NAND gate NA3 which has a high level, and the transmission gate T2 is turned off.

In this case, the two enable signals ENABLE1 and ENABLE2 are in the same high level state. When the two enable signals ENABLE1 and ENABLE2 are in the same high level state, as both the NMOS transistors N11 and N12 for defining current paths are turned on, the data input device of a semiconductor memory apparatus according to the present invention reaches the highest level of current driving capacity in the standby state.

Conversely, if both the clock enable signal CKE and the external command signal CSB comprise high signals, the transmission gate T1 is turned off, and at this time, the state of second enable signal ENABLE2 is determined by the external command signals RASB, CASB and CSB. That is to say, if the external command signals RASB, CASB and CSB toggle in the same state by repeating a high state and a low state as in the case of measuring standby current, the second enable signal ENABLE2 becomes a low signal. Accordingly, in this case, the first enable signal ENABLE1 comprises a high signal, and the second enable signal ENABLE2 comprises a low signal.

Therefore, the second enable signal ENABLE2 is in a low level state, and the first enable signal ENABLE1 is in a high level state. At this time, only the NMOS transistor N11 is turned on by the first enable signal ENABLE1 being in the high level state. Accordingly, in the data input device of a semiconductor memory according to the present invention, current driving capacity in the standby state relatively decreases when compared to the case in which both the NMOS transistors N11 and N12 are turned on.

Therefore, in the present invention, the second enable signal ENABLE2 is maintained at the same state as the first enable signal ENABLE1, except when the clock enable signal CKE and the external command signal CSB comprise high signals and all the external command signals RASB, CASB and CSB are in a high level or a low level.

Figure 8:
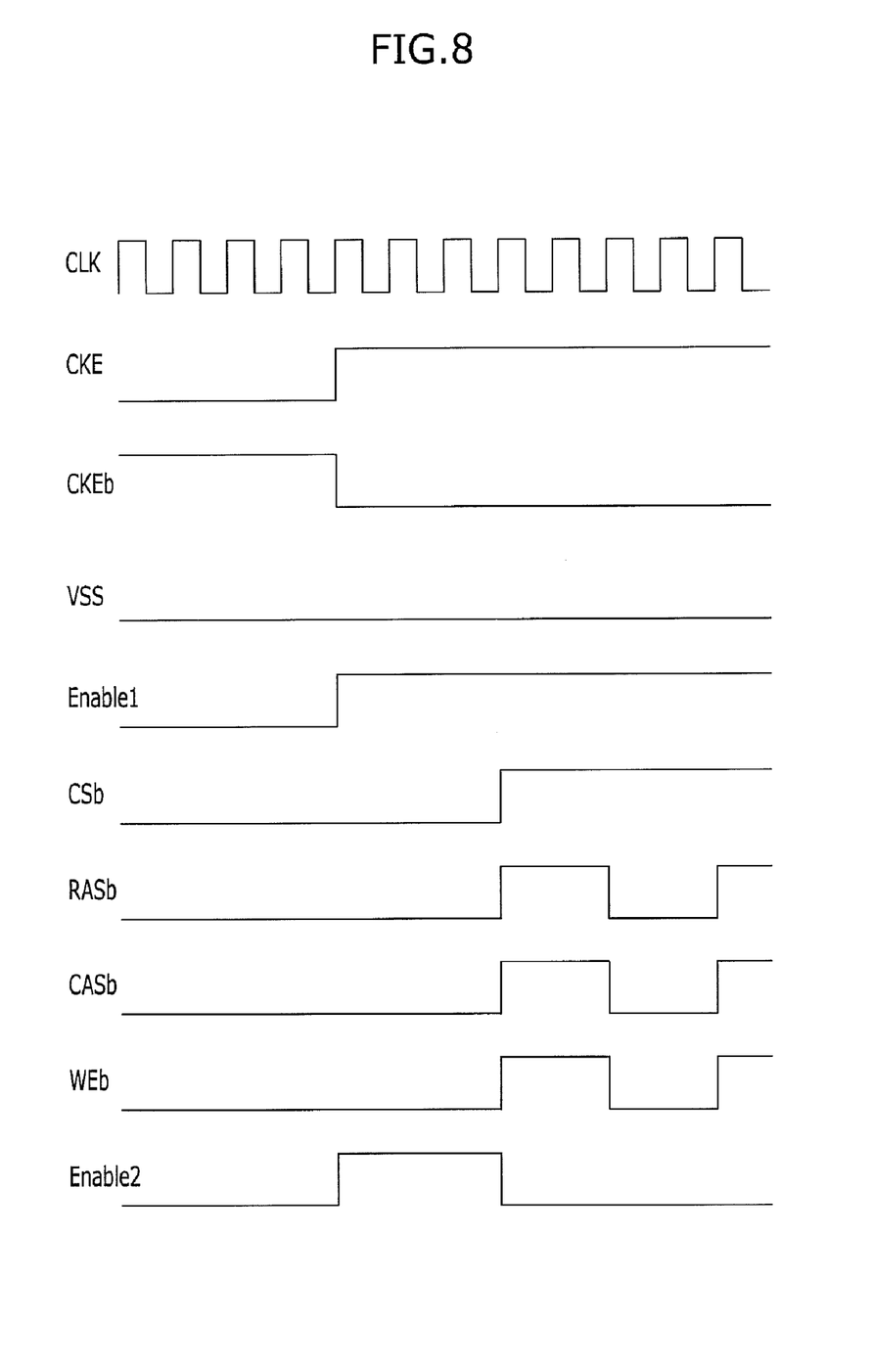
FIG. 8 is a timing diagram of the enable signals used in the data input device of a semiconductor memory apparatus according to the present invention.
Figure 9:
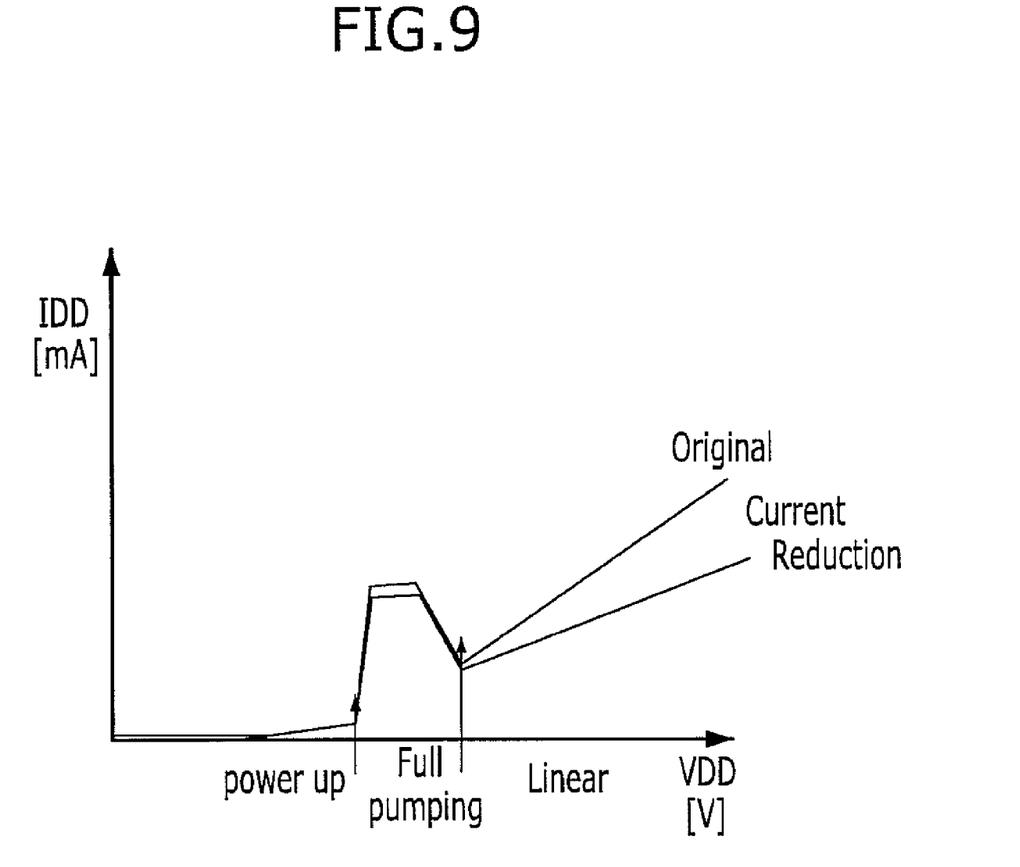
FIG. 9 is a graph shown a standby IDD curve of the data input device of a semiconductor memory apparatus according to the present invention in a standby state.

FIG. 8 is a timing diagram of the enable signals ENABLE1 and ENABLE2 used in the data input device of a semiconductor memory apparatus according to the present invention. Referring to FIG. 8, in the present invention, while the second enable signal ENABLE2 is maintained at the same state as the first enable signal ENABLE1, in the case where the clock enable signal CKE and the external command signal CSB are converted to a high state and the external command signals RASB, CASB and CSB toggle to a same one of a high level or a low level, the second enable signal ENABLE2 is controlled to be a low signal, so that current driving capacity due to the reception of an address in the standby state can be reduced. FIG. 9 is a graph showing a standby IDD curve of the data input device of a semiconductor memory apparatus according to the present invention in a standby state. Referring to FIG. 9, it can be confirmed that the slope of the curve decreases with the increase of the external supply voltage VDD when compared to the conventional art.

As is apparent from the above description, in the present invention, by controlling address receiving operation in a standby state, current consumption due to toggling upon the address receiving operation can be reduced. Accordingly, in the present invention, as current consumption is reduced in the standby state, power consumption of a semiconductor memory apparatus can be reduced.

The present invention has been described with respect to the specific embodiment only for the purpose of illustration. The present invention can be applied in the case of implementing control operation so as to reduce current consumption while maintaining an enable state. Therefore, it will be apparent to those skilled in the art that various changes and modifications may be made without departing from the spirit and scope of the invention as defined in the following claims.

What is claimed is:

1. A data input device of a semiconductor memory apparatus, comprising:
   a differential amplifier configured to receive input data and convert the inputted data to a differential signal;
   a current switch circuit configured to switch on a current flowing through the differential amplifier; and
   a control signal generating circuit configured to control an amount of the current flowing through the current switch circuit in a standby mode,
   wherein the control signal generating circuit comprises:
      a first signal generation section configured to generate a first enable signal in response to a clock enable signal;
      a second signal generation section configured to generate a second enable signal in response to a plurality of external command signals; and
      a switching section configured to transfer or stop the transfer of outputs of the first and second signal generation sections depending upon operational states of the clock enable signal and an external command signal.

2. The data input device of claim 1, wherein the control signal generating circuit is configured to control the amount of the current flowing through the current switch circuit in an address reception operation performed during the standby mode.

3. The data input device of claim 1, wherein the second signal generation section is configured to use the plurality of external command signals.

4. The data input device of claim 1, wherein, when the clock enable signal is in a high state, the switching section is configured to be turned on such that the first and second enable signals are controlled to be in the same state.

5. The data input device of claim 1, wherein, when the clock enable signal and the external command signal are in a high state, a state of the second enable signal is determined in response to the output of the second signal generation section.

6. The data input device of claim 5, wherein, during a time that the plurality of external command signals toggle back and forth between a status of all being high signals and a status of all being low signals repeatedly, the second enable signal is controlled to be a low state signal.

7. The data input device of claim 1, wherein the differential amplifier is configured to input not only the inputted data but also commands and addresses.

8. The data input device of claim 7, wherein the differential amplifier comprises MOS transistors.

9. The data input device of claim 1, wherein the differential amplifier includes a current mirror.

10. The data input device of claim 1, wherein the current switch circuit comprises two NMOS transistors connected in parallel between the differential amplifier and a ground source and configured to turn-on or turn-off in response to the first and second enable signals.

11. The data input device of claim 1, wherein an inverter is connected to an output terminal of the differential amplifier.

12. A method for controlling a data input device of a semiconductor memory apparatus, comprising:
   enabling the data input device so that data can be inputted, wherein the data input device is a differential amplifier;
   controlling a current amount of the enabled data input device in an address reception operation performed during a standby mode so that a current flowing through the differential amplifier is not entirely switched off but reduced and the differential amplifier is enabled for the address reception operation performed during the standby mode;
   inputting data to the data input device; and
   converting inputted data to a differential signal and outputting the differential signal,
   wherein controlling a current amount comprises:
      generating a first enable signal by a clock enable signal;
      generating a second enable signal by an external command signal; and
      controlling a transfer or a stop of the transfer of the first and second enable signals depending upon operational states of the clock enable signal and the external command signal.

13. The method of claim 12, wherein, when the clock enable signal is in a high state, controlling a current amount is implemented such that the first and second enable signals are in the same state.

14. The method of claim 12, wherein, when the clock enable signal and the external command signal are in a high state, controlling a transfer or a stop of the transfer is implemented such that a state of the second enable signal is determined by a plurality of external command signals.

15. The method of claim 12, wherein, when a plurality of external command signals toggle between states where they are all high signals or all low signals, controlling a current amount is implemented such that the second enable signal is controlled to be in a low state.

16. A data input device of a semiconductor memory apparatus, comprising:
   a differential amplifier configured to compare an input to a reference voltage and output a differential signal based on the comparison; and
   a control circuit configured to adjust a current driving capacity of the differential amplifier by turning on a first current path connected to the differential amplifier in response to a first enable signal and turning off a second current path connected to the differential amplifier in response to a second enable signal in a standby mode, wherein, during a time that a plurality of external command signals toggle back and forth between a status of all being high signals and a status of all being low signals repeatedly, the second enable signal is controlled to be maintained at a low state signal.

17. The data input device of claim 16, wherein the control circuit comprises a NAND gate configured to receive the plurality of external command signals and another NAND gate configured to receive inverted signals of the plurality of external command signals and a NOR gate connected to outputs of the NAND gates.

* * * * *